US011403826B2

(12) United States Patent
Kikuchi

(10) Patent No.: US 11,403,826 B2
(45) Date of Patent: Aug. 2, 2022

(54) MANAGEMENT SYSTEM AND MANAGEMENT METHOD USING EYEWEAR DEVICE

(71) Applicant: TOPCON CORPORATION, Tokyo (JP)

(72) Inventor: Takeshi Kikuchi, Tokyo (JP)

(73) Assignee: TOPCON CORPORATION, Tokyo (JP)

( * ) Notice: Subject to any disclaimer, the term of this patent is extended or adjusted under 35 U.S.C. 154(b) by 0 days.

(21) Appl. No.: 17/086,998

(22) Filed: Nov. 2, 2020

(65) Prior Publication Data

US 2021/0142576 A1 May 13, 2021

(30) Foreign Application Priority Data

Nov. 11, 2019 (JP) .............................. JP2019-203636

(51) Int. Cl.
| | | |
|---|---|---|
| G06T 19/00 | (2011.01) | |
| G06T 7/70 | (2017.01) | |
| G06F 30/13 | (2020.01) | |
| G06F 3/01 | (2006.01) | |
| G06K 9/62 | (2022.01) | |
| G06Q 10/06 | (2012.01) | |
| G06F 7/57 | (2006.01) | |

(52) U.S. Cl.
CPC ............ G06T 19/006 (2013.01); G06F 3/011 (2013.01); G06F 30/13 (2020.01); G06K 9/6201 (2013.01); G06Q 10/06311 (2013.01); G06T 7/70 (2017.01); G06F 7/57 (2013.01)

(58) Field of Classification Search
None
See application file for complete search history.

(56) References Cited

U.S. PATENT DOCUMENTS

| 2014/0156219 A1* | 6/2014 | Soubra ................... G01C 15/06 |
| | | 702/150 |
| 2016/0260261 A1* | 9/2016 | Hsu ........................... G06T 1/20 |
| 2017/0030706 A1* | 2/2017 | Natori ..................... G06T 7/001 |

(Continued)

FOREIGN PATENT DOCUMENTS

| JP | 2017-204222 A | 11/2017 |
| JP | 2019-148946 A | 9/2019 |
| WO | 2019048866 A1 | 3/2019 |

*Primary Examiner* — Saptarshi Mazumder
(74) *Attorney, Agent, or Firm* — Roberts Calderon Safran & Cole P.C.

(57) ABSTRACT

A management system includes a measuring device including a communication unit and a coordinate measuring unit, an eyewear device including a communication unit, a display, a relative position detection sensor, and a relative direction detection sensor, a storage unit configured to store CAD design data of a management site, and an arithmetic processing unit including a synchronous measuring unit configured to synchronize coordinate spaces of the measuring device, the eyewear device, and the CAD design data, wherein the synchronous measuring unit acquires information of a wire frame viewed from a point at the position in the direction of the eyewear device from the CAD design data, and the eyewear device displays the information of the wire frame that the eyewear device received on the display by superimposing the information on an actual construction product.

8 Claims, 13 Drawing Sheets

(56) References Cited

U.S. PATENT DOCUMENTS

2019/0094021 A1\* 3/2019 Singer .................. G06T 19/006
2019/0272676 A1 9/2019 Finn et al.
2019/0347860 A1\* 11/2019 Steiner ................ G01B 11/002

\* cited by examiner

MANAGEMENT SYSTEM AND MANAGEMENT METHOD USING EYEWEAR DEVICE

TECHNICAL FIELD

The present invention relates to a system and a method for managing construction work by using an eyewear device.

BACKGROUND ART

At a construction site, an operation for confirmation whether a construction is being performed in accordance with CAD design data is essential. Conventionally, to confirm construction accuracy (deviation) between an actual construction product and design data, the actual construction product is measured by a scanner and a surveying instrument (total station), and based on measurement data, a 3D model of the actual construction product is made and compared with the design data (for example, Patent Literature 1).

CITATION LIST

Patent Literature

[Patent Literature 1] Japanese Published Unexamined Patent Application No. 2017-204222

SUMMARY OF INVENTION

Technical Problem

However, in the conventional method, an operation for temporarily making a 3D model of an actual construction product is required. In addition, it is difficult to instantaneously confirm any deviation on-site during construction work.

The present invention has been made in view of the problems described above, and an object thereof is to enable display and confirmation of construction accuracy (deviation) between an actual construction product and CAD design data in real time on-site.

Solution to Problem

In order to achieve the object described above, a management system according to an aspect of the present invention includes a measuring device including a communication unit and a coordinate measuring unit for acquiring three-dimensional coordinates of a target, an eyewear device including a communication unit, a display, a relative position detection sensor configured to detect a position of the eyewear device, and a relative direction detection sensor configured to detect a direction that the eyewear device faces, a storage unit configured to store CAD design data of a management site, and an arithmetic processing unit including a synchronous measuring unit configured to receive information on a position and a direction of the measuring device and information on a position and a direction of the eyewear device, and synchronize a coordinate space of the measuring device, a coordinate space of the eyewear device, and a coordinate space of the CAD design data, wherein the synchronous measuring unit acquires information of a wire frame viewed from a point at the position in the direction of the eyewear device from the CAD design data, and the eyewear device displays the information of the wire frame that the eyewear device received on the display by superimposing the information on an actual construction product.

In the aspect described above, it is also preferable that the synchronous measuring unit calculates, as difference information, a difference from a measurement point designated by an administrator on the CAD design data to a coordinate point of the target set corresponding to the measurement point by the administrator, and the eyewear device displays a numerical value of the difference information that the eyewear device received on the display.

In the aspect described above, it is also preferable that the measuring device further includes an image pickup unit configured to acquire local coordinates, the arithmetic processing unit further includes an image analyzing unit configured to perform pattern matching between an image captured by the image pickup unit and the CAD design data, the synchronous measuring unit calculates the difference information for a plurality of characteristic points matched by the image analyzing unit, and the eyewear device converts the difference information that the eyewear device received into an image from which the magnitude of the difference is visually understood, and displays the image on the display.

In the aspect described above, it is also preferable that the measuring device is a surveying instrument including, as the coordinate measuring unit, a distance-measuring unit configured to measure a distance to the target by emitting distance-measuring light, and an angle-measuring unit configured to measure a rotation angle in the horizontal direction and a rotation angle in the vertical direction of the distance-measuring unit.

In the aspect described above, it is also preferable that the measuring device is a plurality of cameras each including, as the coordinate measuring unit, an image sensor and an image analyzing unit configured to capture an image of a surrounding landscape including the target and acquire local coordinates.

A management method according to an aspect of the present invention uses a measuring device including a communication unit and a coordinate measuring unit for acquiring three-dimensional coordinates of a target, and an eyewear device including a communication unit, a display, a relative position detection sensor configured to detect a position of the eyewear device in a management site, and a relative direction detection sensor configured to detect a direction that the eyewear device faces, and includes a step of receiving information on a position and a direction of the measuring device and information on a position and a direction of the eyewear device, and synchronizing a coordinate space of the measuring device, a coordinate space of the eyewear device, and a coordinate space of CAD design data of the management site, a step of receiving the information on the position and the direction of the eyewear device, and transmitting information of a wire frame of the CAD design data viewed from a point indicated by the information to the eyewear device, and a step of displaying the received information of the wire frame on the display by superimposing the information on an actual construction product.

In the aspect described above, it is also preferable that the management method further includes a step of making an administrator designate a measurement point on the CAD design data, a step of making the administrator set a target corresponding to the measurement point, and acquiring three-dimensional coordinates of the target, a step of calculating, as difference information, a difference from the measurement point to a coordinate point of the target, and a step of displaying a numerical value of the difference information on the display.

In the aspect described above, it is also preferable that the measuring device further includes an image pickup unit configured to acquire local coordinates, and the management method further includes a step of making the administrator designate a plurality of measurement points on the CAD design data, a step of making the administrator set a plurality of targets corresponding to the measurement points, and acquiring three-dimensional coordinates of the respective targets, a step of capturing images of surrounding landscapes including the targets by the image pickup unit, a step of performing pattern matching between the images captured by the image pickup unit and the CAD design data, a step of calculating the difference information for a plurality of characteristic points matched by the pattern matching, and a step of converting the difference information into an image from which the magnitude of the difference is visually understood, and displaying the image on the display.

Effect of Invention

According to the management system and the management method of the present invention, construction accuracy (deviation) between an actual construction product and CAD design data can be confirmed in real time on-site.

DESCRIPTION OF EMBODIMENTS

Next, preferred embodiments of the present invention will be described with reference to the drawings.

First Embodiment

Figure 1:
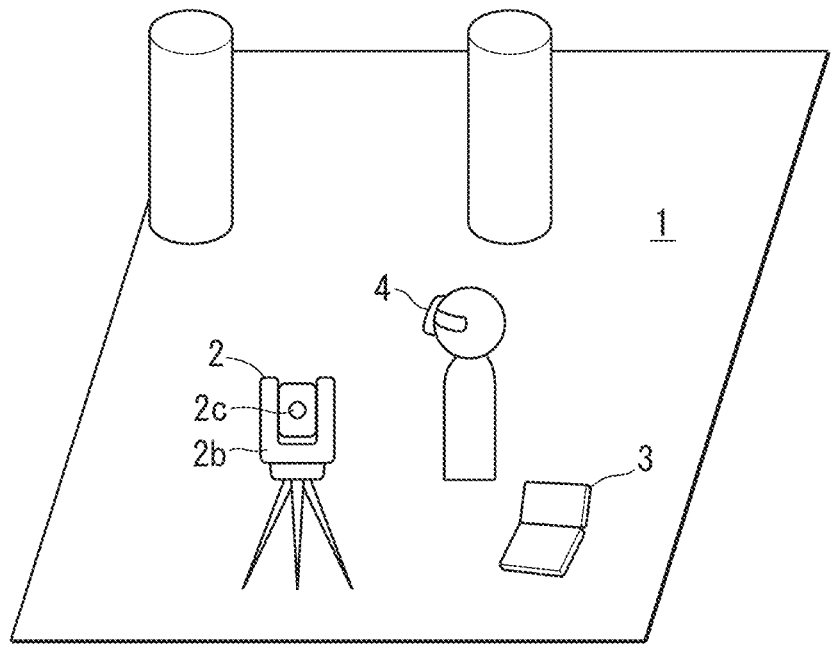
FIG. 1 is an external perspective view of a management system according to a first embodiment.

FIG. 1 is an external perspective view of a management system 1 according to a first embodiment, and illustrates an operation image at a construction site to be managed. The management system 1 according to the present embodiment includes a surveying instrument 2, a processing PC 3, and an eyewear device 4. In the present embodiment, the surveying instrument 2 is the "measuring device," and a distance-measuring unit 19 and angle-measuring units 11 and 12 described later are the "coordinate measuring unit."

The surveying instrument 2 is installed at an arbitrary point by using a tripod. The surveying instrument 2 includes a base portion provided on a leveling device, a bracket portion 2b that rotates horizontally on the base portion, and a telescope 2c that rotates vertically at the center of the bracket portion 2b. The eyewear device 4 is worn on the head of an administrator. The processing PC 3 is installed in the construction site.

Figure 2:
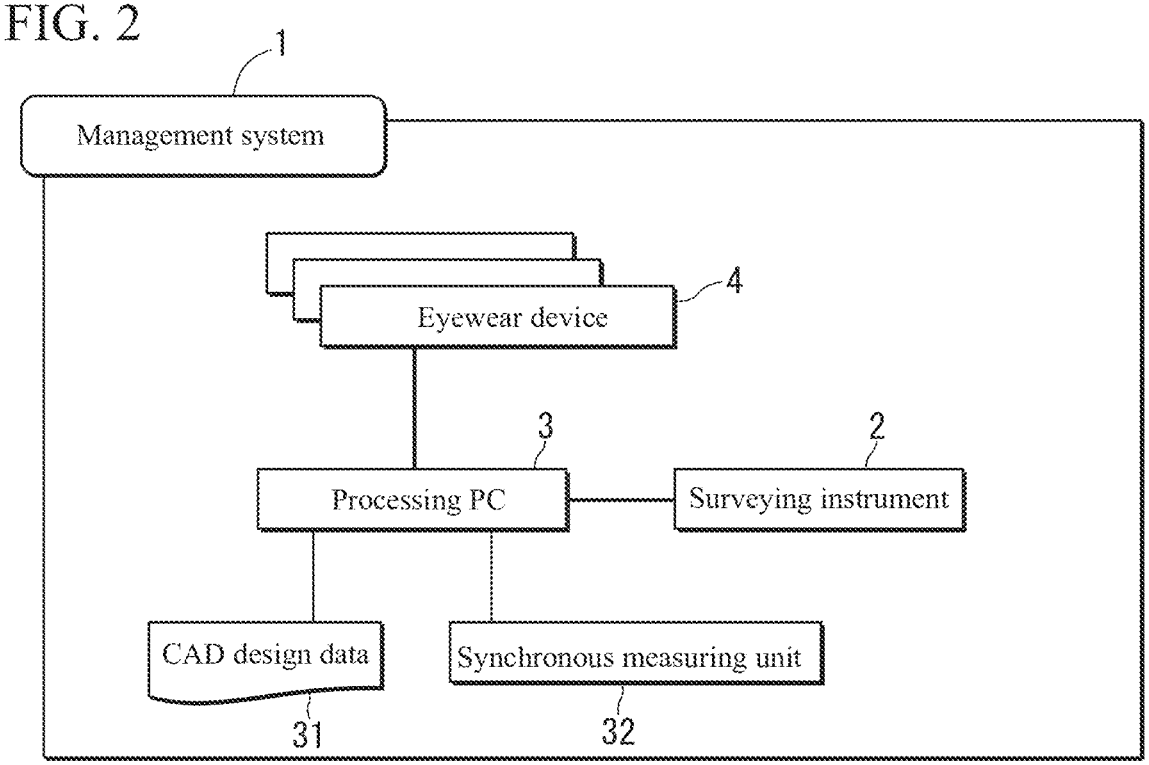
FIG. 2 is a configuration block diagram of the same management system.

FIG. 2 is a configuration block diagram of the same management system 1. In the management system 1, the eyewear device 4 and the surveying instrument 2 are connected wirelessly to the processing PC 3 (wired connection is also possible). The eyewear device 4 to be connected may be either single or plural in number. When a plurality of eyewear devices are connected, each eyewear device 4 is identified by its unique ID, etc. The processing PC 3 includes CAD design data 31 of the construction site to be managed, and a synchronous measuring unit 32 described later. Details of these will be described later.

(Surveying Instrument)

Figure 3:
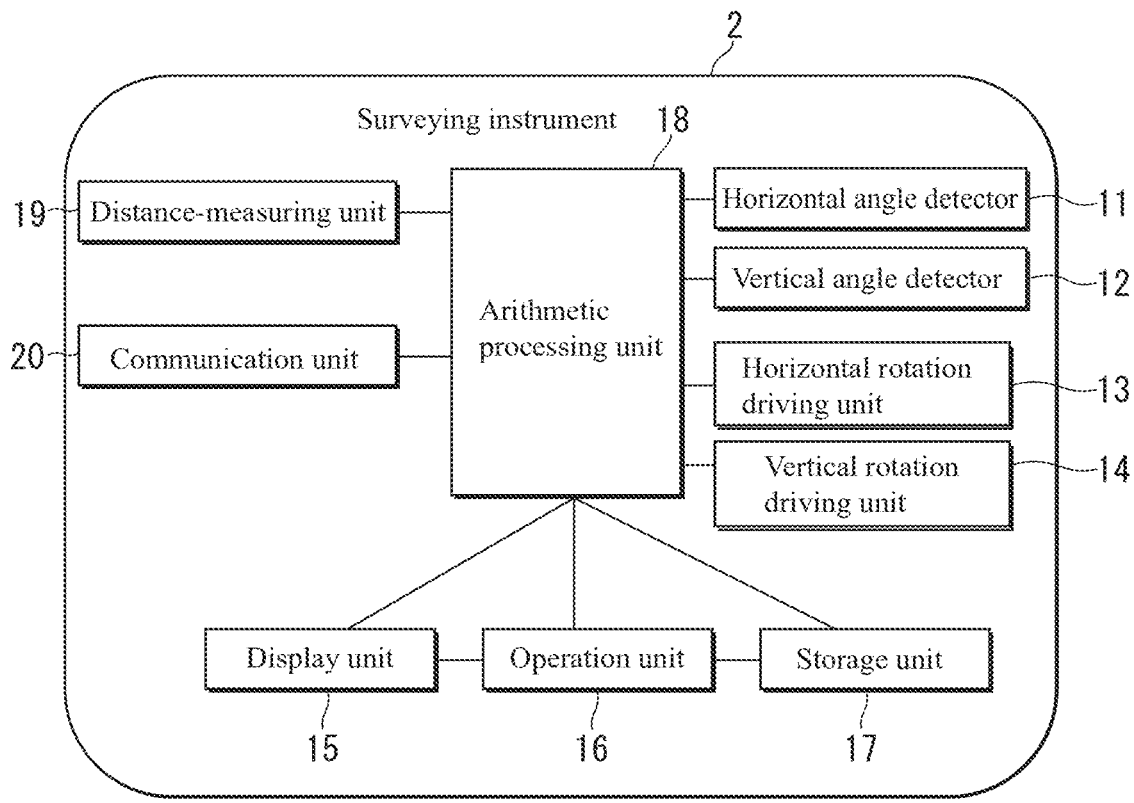
FIG. 3 is a configuration block diagram of a surveying instrument according to the first embodiment.

FIG. 3 is a configuration block diagram of the surveying instrument 2 according to the first embodiment. The surveying instrument 2 is a total station. The surveying instrument 2 includes a horizontal angle detector 11, a vertical angle detector 12, a horizontal rotation driving unit 13, a vertical rotation driving unit 14, a display unit 15, an operation unit 16, a storage unit 17, an arithmetic processing unit 18, a distance-measuring unit 19, and a communication unit 20.

The horizontal rotation driving unit 13 and the vertical rotation driving unit 14 are motors, and are controlled by the arithmetic processing unit 18. The horizontal rotation driving unit 13 rotates the bracket portion 2b in the horizontal direction, and the vertical rotation driving unit 14 rotates the telescope 2c in the vertical direction.

The horizontal angle detector 11 and the vertical angle detector 12 are encoders. The horizontal angle detector 11 measures a rotation angle of the bracket portion 2b in the horizontal direction, and the vertical angle detector 12 measures a rotation angle of the telescope 2a in the vertical direction. The horizontal angle detector 11 and the vertical angle detector 12 are the angle-measuring unit.

The display unit 15 includes a liquid crystal panel display. The operation unit 16 includes a power key, numeric keys, a decimal key, plus/minus keys, an enter key, and a scroll key, etc., and can operate the surveying instrument 2.

The distance-measuring unit 19 includes a light emitting element, a light transmitting optical system, a light receiving optical system that shares optical elements with the light transmitting optical system, and a light receiving element. The distance-measuring unit 19 emits distance-measuring light such as an infrared laser to a target, and receives reflected distance-measuring light from the target by the light receiving element.

The communication unit 20 enables communication with an external network, and connects to the Internet by using an Internet protocol (TCP/IP) and transmits and receives information to and from the processing PC 3.

The arithmetic processing unit 18 is a control unit configured by mounting at least a CPU and a memory (RAM, ROM, etc.) on an integrated circuit. The arithmetic processing unit 18 controls the horizontal rotation driving unit 13 and the vertical rotation driving unit 14. In addition, the arithmetic processing unit 18 calculates a distance measurement value to the target from a phase difference between the reflected distance-measuring light and reference light having advanced along a reference light path provided in the optical systems described above. Further, the arithmetic processing unit 18 calculates an angle measurement value to the target from the horizontal angle detector 11 and the vertical angle detector 12. In addition, the arithmetic processing unit 18 communicates with the processing PC 3 via the communication unit 20.

The storage unit 17 is, for example, a memory card, an HDD, etc. In the storage unit 17, survey programs to be executed by the arithmetic processing unit 18 are stored. In addition, various types of information acquired by the arithmetic processing unit 18 are recorded.

(Eyewear Device)

Figure 4:
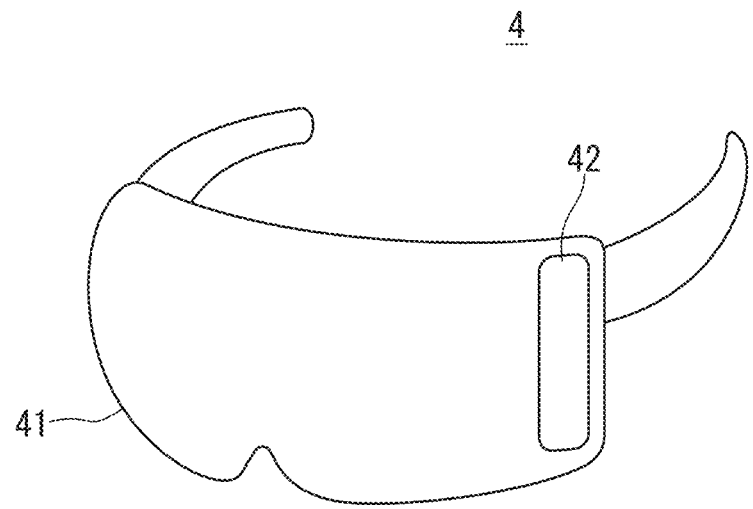
FIG. 4 is an external perspective view of an eyewear device according to the first embodiment.
Figure 5:
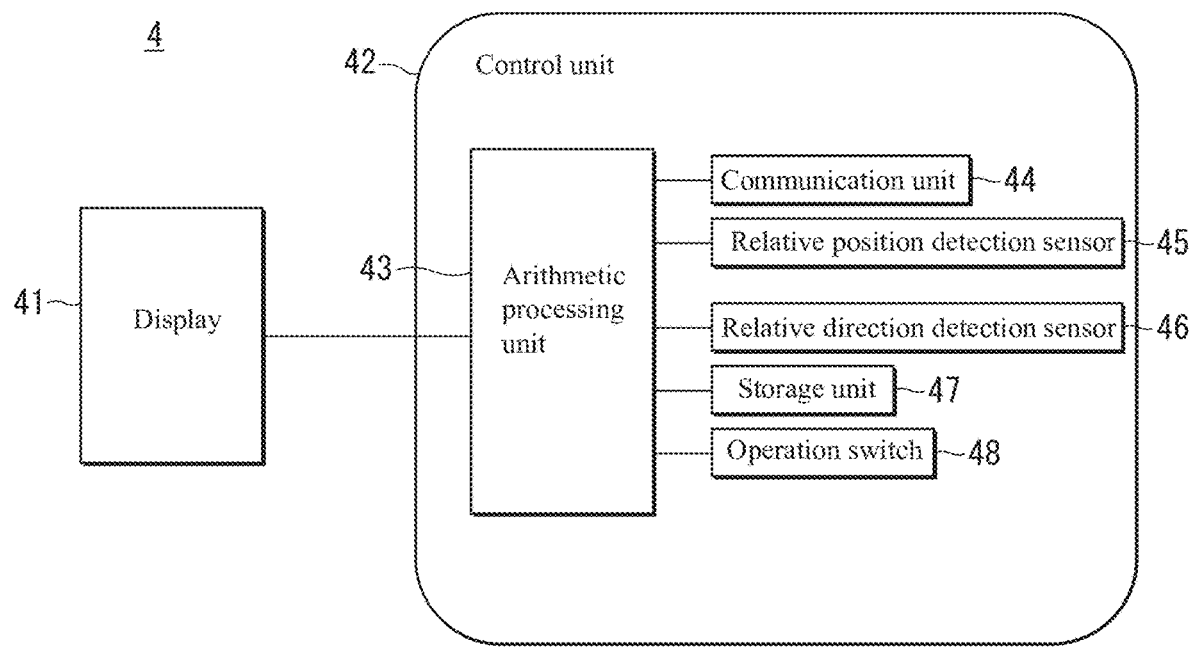
FIG. 5 is a configuration block diagram of the same eyewear device.

FIG. 4 is an external perspective view of the eyewear device 4 according to the first embodiment, and FIG. 5 is a configuration block diagram of the eyewear device 4. The eyewear device 4 is a wearable device to be worn on the head of an administrator. The eyewear device 4 includes a display 41 and a control unit 42.

The display 41 is basically a transmissive type that covers both eyes of an administrator. As an example, the display 41 is an optical see-through display using a half mirror, and an administrator can view an image in which a real image of a site landscape is synthesized with a virtual image received by the control unit 42.

The control unit 42 includes an arithmetic processing unit 43, a communication unit 44, a relative position detection sensor 45, a relative direction detection sensor 46, a storage unit 47, and an operation switch 48.

The communication unit 44 of the eyewear enables communication with an external network, and connects to the Internet by using an Internet protocol (TCP/IP) and transmits and receives information to and from the processing PC 3.

The relative position detection sensor 45 (hereinafter, simply referred to as a relative position sensor 45,) performs wireless positioning from an indoor GPS antenna, a Wi-Fi (registered trademark) access point, and an ultrasonic oscillator, etc., installed at the construction site, to detect a position of the eyewear device 4 in the construction site.

The relative direction detection sensor 46 (hereinafter, simply referred to as a relative direction sensor 46,) is a triaxial accelerometer or a combination of gyro and a tilt sensor. The relative direction sensor 46 detects a tilt of the eyewear device 4 by setting the up-down direction as a Z-axis direction, the left-right direction as a Y-axis direction, and the front-rear direction as an X-axis direction.

The operation switch 48 includes a power switch and a select switch.

The storage unit 47 of the eyewear is, for example, a memory card, etc. In the storage unit 47, processing programs to be executed by the arithmetic processing unit 43 are stored.

The arithmetic processing unit 43 of the eyewear is a control unit configured by mounting at least a CPU and a memory (RAM, ROM, etc.) on an integrated circuit. The arithmetic processing unit 43 transmits information on a position and a direction of the eyewear device 4 detected by the relative position sensor 45 and the relative direction sensor 46 to the processing PC 3. Then, the arithmetic processing unit 43 receives information on design data viewed from a point at the position in the direction described above from the processing PC 3, and displays a wire frame on the display 41.

(Processing PC)

Figure 6:
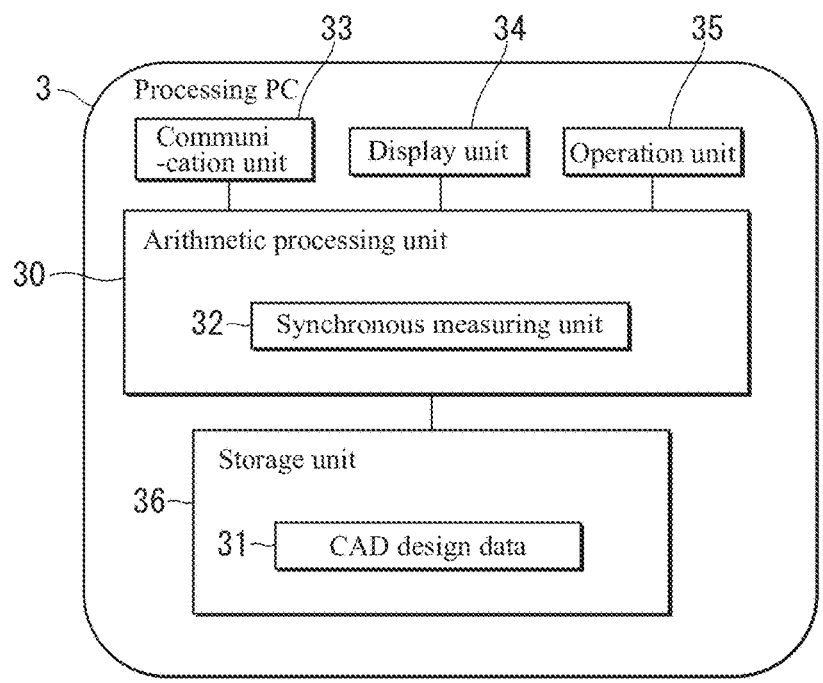
FIG. 6 is a configuration block diagram of a processing PC according to the first embodiment.

FIG. 6 is a configuration block diagram of the processing PC 3 according to the first embodiment. The processing PC 3 is a general-purpose personal computer, exclusive hardware using a PLD (Programmable Logic Device), etc., a tablet terminal, or a smartphone, etc. The processing PC 3 includes at least a communication unit 33, a display unit 34, an operation unit 35, a storage unit 36, and an arithmetic processing unit 30.

The communication unit 33 of the PC enables communication with an external network, and connects to the Internet by using an Internet protocol (TCP/IP) and transmits and receives information to and from the surveying instrument 2 and the eyewear device 4.

The display unit 34 of the PC includes a liquid crystal panel display, and the PC operation unit 35 enables various inputs, selections, and determinations concerning management operations.

The storage unit 36 of the PC HDD, etc., and stores at least CAD design data 31 of the construction site to be managed.

The arithmetic processing unit 30 is a control unit configured by mounting at least a CPU and a memory (RAM, ROM, etc.) on an integrated circuit. In the arithmetic processing unit 30, a synchronous measuring unit 32 is configured by software.

The synchronous measuring unit 32 receives information on a position and a direction of the surveying instrument 2 and information on a position and a direction of the eyewear device 4, and synchronizes a coordinate space of the surveying instrument 2, a coordinate space of the eyewear device 4, and a coordinate space of the CAD design data 31. Then, the synchronous measuring unit 32 transmits information of the synchronized CAD design data 31 to the eyewear device 4. In addition, the synchronous measuring unit 32 calculates a portion whose difference is desired to be calculated. Details of this will be described later.

(Management Method)

Figure 7:
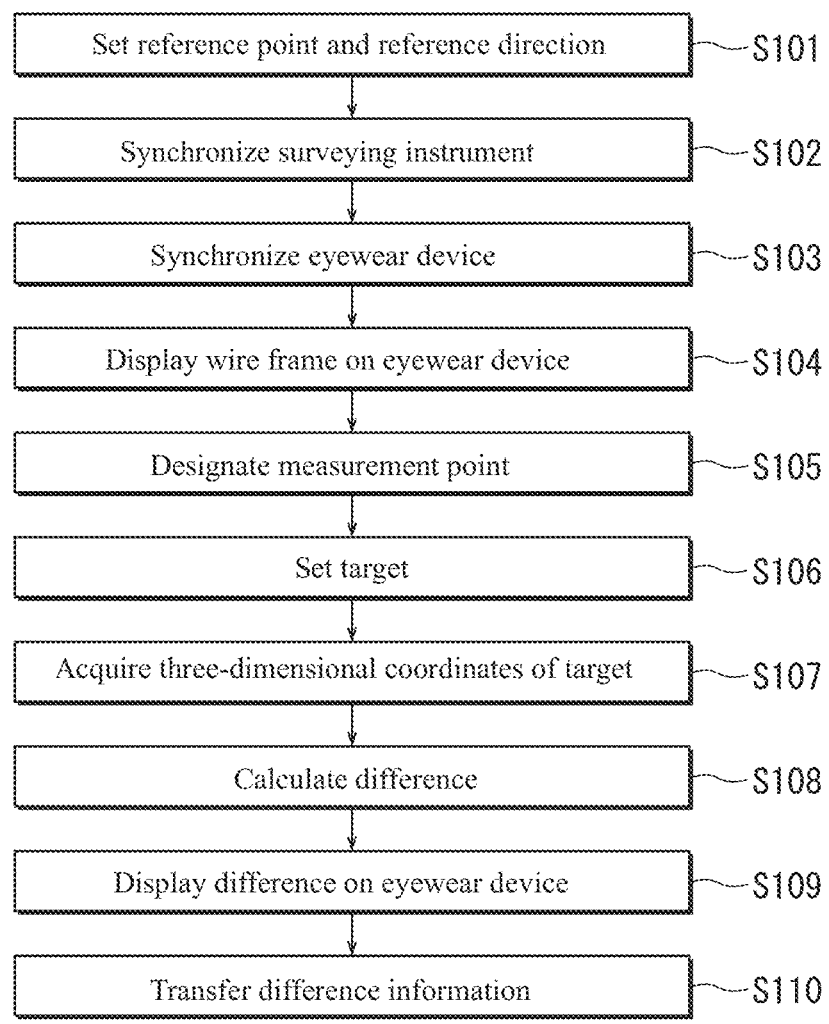
FIG. 7 is a management flowchart by the management system according to the first embodiment.
Figure 8:
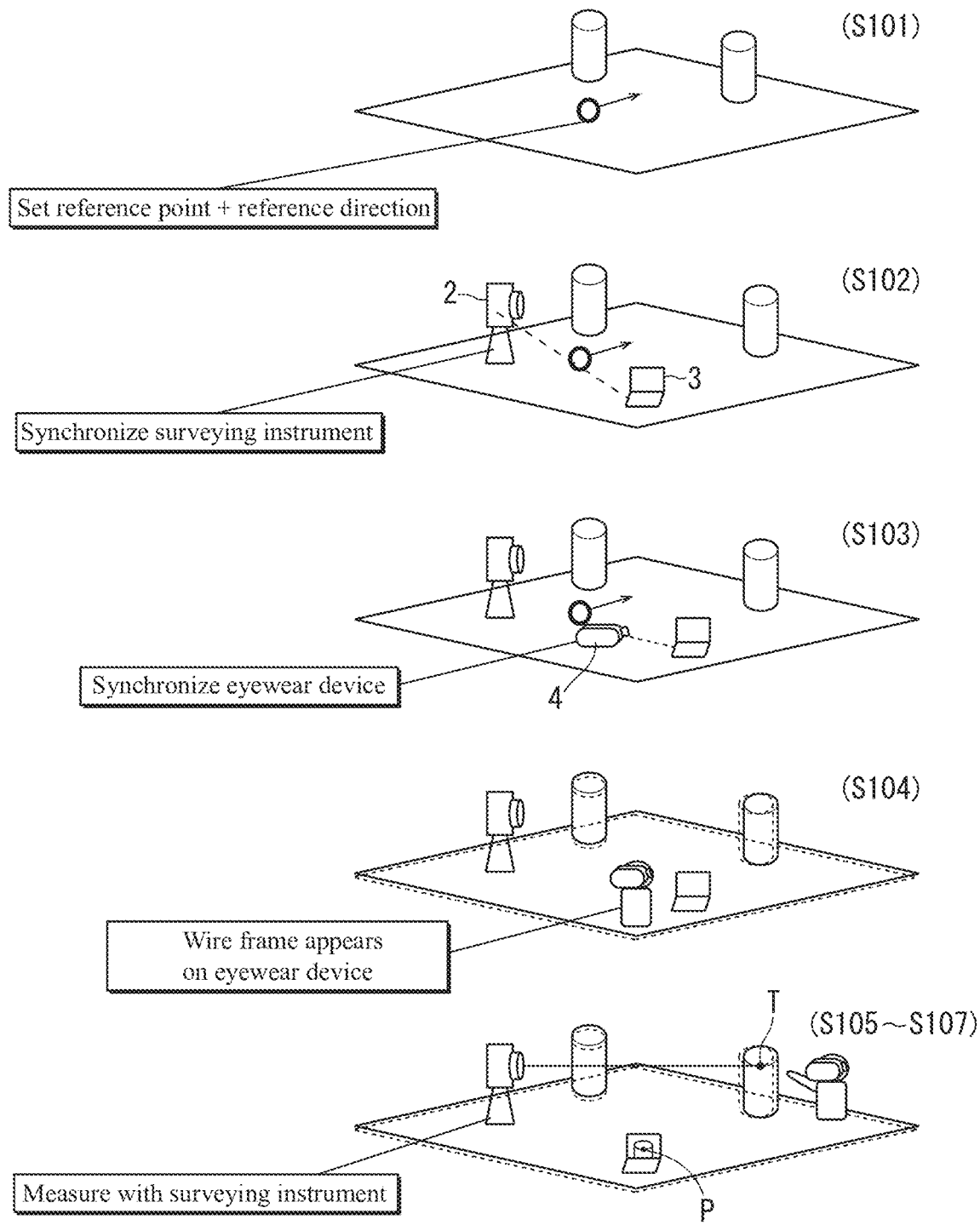
FIG. 8 is an operation imaginary view of the same management flow.
Figure 9:
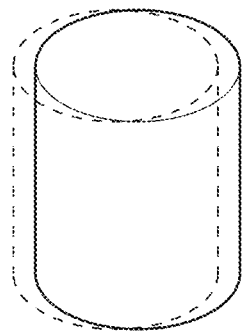
FIG. 9 is an imaginary view of an image to be obtained by the same management system.
Figure 10:
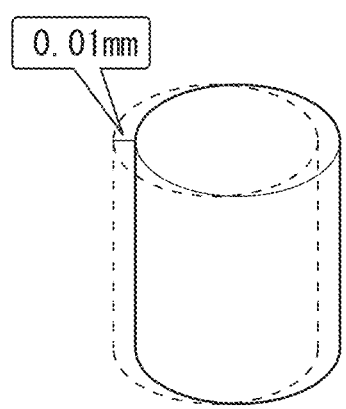
FIG. 10 is an imaginary view of an image to be obtained by the same management system.

Next, a management method using the management system 1 is described. FIG. 7 is a management flowchart by the management system 1 according to the first embodiment, FIG. 8 is an operation imaginary view of the same management flow, and FIGS. 9 and 10 are imaginary views of an image to be obtained by the same management system 1.

First, in Step S101, an administrator sets a reference point and a reference direction at a construction site. As the reference point, a point at prescribed coordinates or arbitrary in the site is selected. For setting the reference direction, a characteristic point (a post in FIG. 8, etc.) different from the reference point is arbitrarily selected, and a direction from the reference point to the characteristic point is set as the reference direction.

Next, the process shifts to Step S102, and the administrator performs synchronization of the surveying instrument 2. Specifically, the administrator installs the surveying instrument 2 at an arbitrary point in the site, and grasps absolute coordinates of the surveying instrument 2 through observation using backward intersection, etc., including the reference point and the characteristic point. The surveying instrument 2 transmits coordinate information to the processing PC 3. The synchronous measuring unit 32 of the processing PC 3 converts the absolute coordinates of the reference point into (x, y, z)=(0, 0, 0) and recognizes the reference direction as a direction with a horizontal angle of 0 degrees, and after this, in relation to information from the surveying instrument 2, manages a relative position and a relative direction of the surveying instrument 2 in a space with an origin set at the reference point.

Next, the process shifts to Step S103, and the administrator performs synchronization of the eyewear device 4. Specifically, the administrator installs the eyewear device 4 at the reference point, matches the center of the display 41 with the reference direction, and set (x, y, z) of the relative position sensor 45 to (0, 0, 0) and set (roll, pitch, yaw) of the relative direction sensor 46 to (0, 0, 0). After this, in relation to information from the eyewear device 4, the synchronous measuring unit 32 of the processing PC 3 manages a relative position and a relative direction of the eyewear device 4 in the space with an origin set at the reference point. As synchronization of the eyewear device 4, it is also preferable that the eyewear device 4 is provided with a laser device for indicating the center and the directional axis of the eyewear device 4, and by using a laser as a guide, the center and the directional axis are matched with the reference point and the reference direction. Alternatively, a method is possible in which the eyewear device 4 is provided with a visual line sensor, etc., three or more characteristic points are marked in the design data and the actual construction product, coordinates of the eyewear device 4 are identified from an angle of a survey line connecting the eyewear device and a known point, and are made correspondent to the coordinates of the reference point.

Next, the process shifts to Step S104, and the administrator wears the eyewear device 4 and views a portion (actual construction product) that the administrator desires to manage in the construction site. The relative position and the relative direction of the eyewear device 4 to the actual construction product are managed by the processing PC 3, so that information of the CAD design data 31 synchronized with the actual construction product (a real image of the site landscape viewed through the display 41) is transmitted from the processing PC 3 to the eyewear device 4. Then, a virtual image of a wire frame of the CAD design data 31 is displayed on the display 41 so that it is superimposed on the actual construction product.

FIG. 9 is a display example on the display 41 at the time of Step S104. In FIG. 9, the actual construction product is displayed by solid lines, and the wire frame is displayed by dashed lines. As illustrated in FIG. 9, the actual construction product and the wire frame appear to overlap to the administrator wearing the eyewear device 4, so that the administrator can confirm on-site that there is a deviation between the actual construction product and the design data.

Next, when the administrator desires to confirm construction accuracy, the process shifts to Step S105. In Step S105, the administrator designates a portion (point) whose construction accuracy is desired to be confirmed as a "measurement point" in the processing PC 3. For example, the "measurement point" is designated by means of a mouse or a touch panel after the wire frame of the CAD design data 31 is displayed on the display unit 34 of the processing PC 3 (for example, the reference sign P in FIG. 8).

Next, the process shifts to Step S106, and the administrator sets a target (for example, the reference sign T in FIG. 8) at the portion of the actual construction product corresponding to the measurement point designated on the CAD.

Next, the process shifts to Step S107, and the administrator or another operator collimates the target using the surveying instrument 2, and measures a distance and an angle of the target. The surveying instrument 2 transmits three-dimensional coordinates of the target to the processing PC 3.

Next, the process shifts to Step S108, and the processing PC 3 acquires the three-dimensional coordinates of the target. The synchronous measuring unit 32 connects the measurement point and the coordinate point of the target with a line on the CAD, and calculates a difference in the horizontal direction and a difference in the vertical direction as viewed from a point at the position in the direction of the eyewear device 4. Then, the processing PC 3 transmits the calculated "difference information (the difference in the horizontal direction and the difference in the vertical direction)" to the eyewear device 4.

Next, the process shifts to Step S109, and the eyewear device 4 displays a numerical value of the difference information that the eyewear device 4 received on the display 41. FIG. 10 illustrates a display example on the display 41 at the time of Step S109. In FIG. 10, as difference information, a numerical value of the difference of the measurement point in the horizontal direction is displayed near the measurement point. For numerical value display, a lead line, a balloon, an arrow, etc., is also preferably used. In this way, the administrator can display and confirm difference information between the actual construction product and the design data along with a synthesized image of the actual construction product and the wire frame on-site. In addition, the administrator can switch between display of the difference in the horizontal direction and display of the difference in the vertical direction as appropriate by the operation switch 48 of the eyewear device 4.

Next, the process shifts to Step S110, and in a case where setting for transferring the difference information to another external device has been made, the processing PC 3 transmits the difference information to the device. Steps S104 to S110 described above are repeated according to the needs of the administrator.

As described above, according to the management system 1 of the present embodiment, by wearing the eyewear device 4, an administrator can view an image in which the wire frame of the CAD design data 31 is superimposed on the actual construction product from an arbitrary position and an arbitrary direction. Therefore, construction accuracy (deviation) between the actual construction product and the design data can be visually confirmed in real time on-site.

In addition, the administrator can directly view the actual construction product with the eyewear device 4, so that an operation of temporarily making a 3D model of the actual construction product as in the conventional method is not required.

In addition, by measuring the portion whose construction accuracy (deviation) is desired to be confirmed with the synchronized surveying instrument 2, an actual deviation amount (numerical value) between the actual construction product and the design data can also be displayed and confirmed in real time on-site.

Second Embodiment

Figure 11:
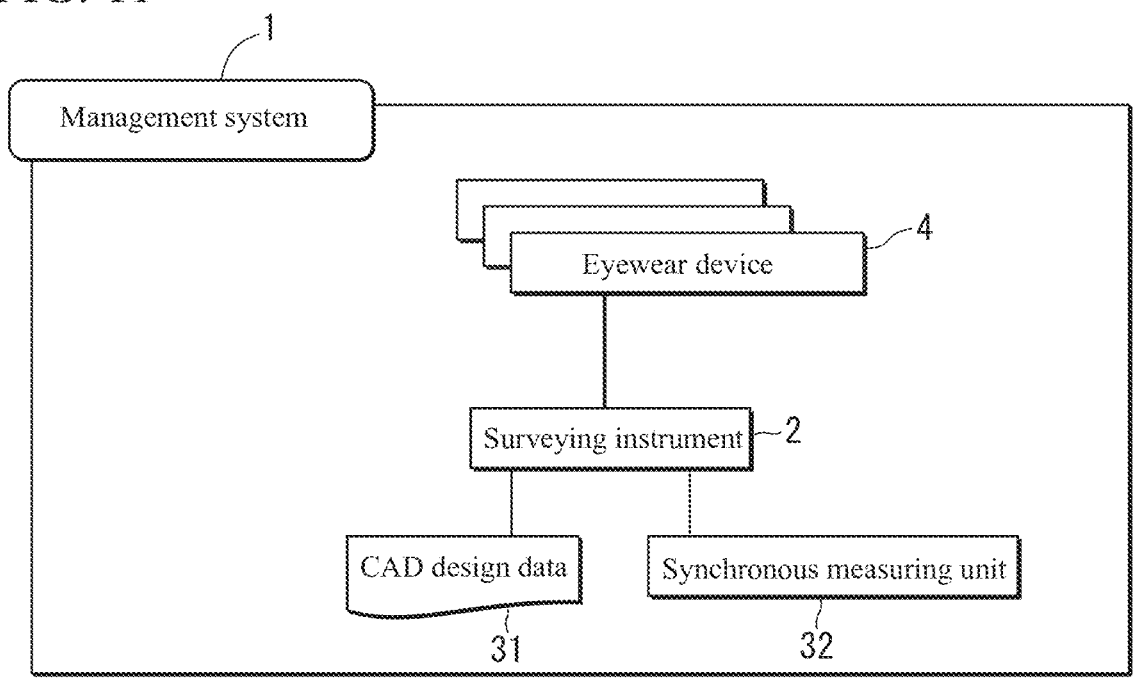
FIG. 11 is a configuration block diagram of a management system according to a second embodiment.
Figure 12:
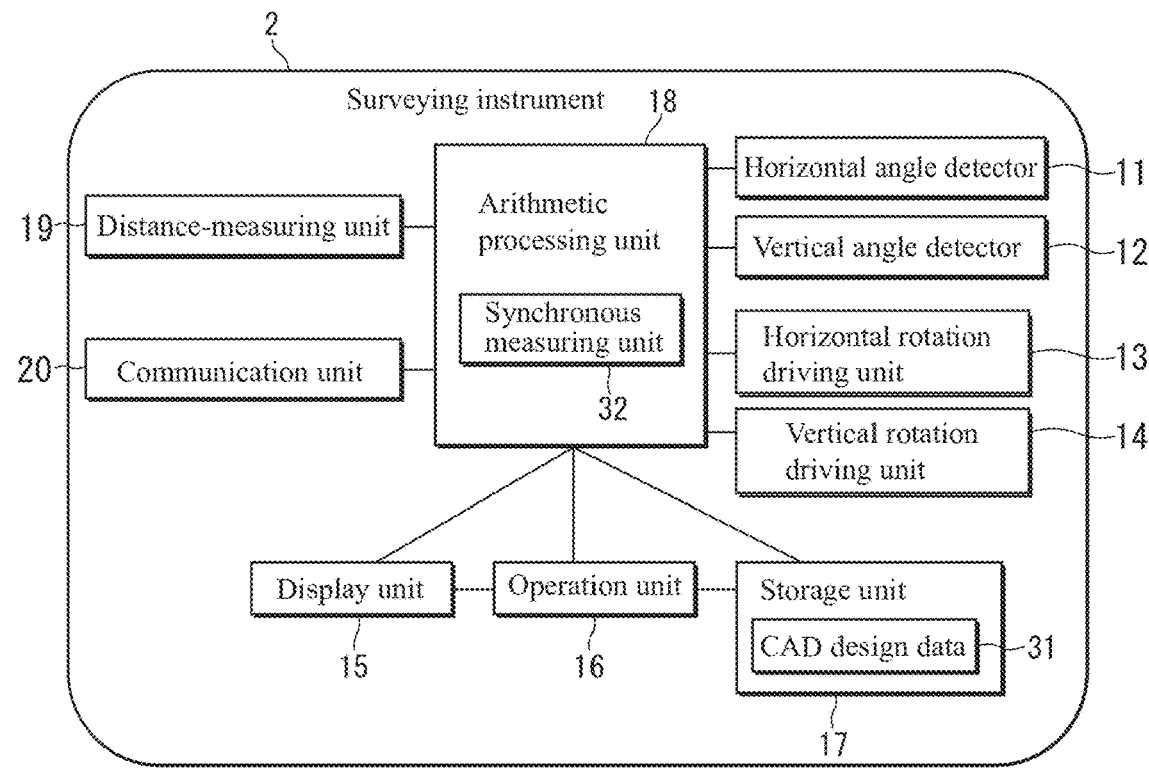
FIG. 12 is a configuration block diagram of a surveying instrument according to the same embodiment.

FIG. 11 is a configuration block diagram of a management system 1 according to a second embodiment, and FIG. 12 is a configuration block diagram of a surveying instrument 2 according to the same embodiment. The same components as those described in the first embodiment are provided with the same reference signs, and descriptions of these are omitted.

The management system 1 according to the present embodiment includes a surveying instrument 2 and an eyewear device 4. The eyewear device 4 has the same configuration as in the first embodiment. On the other hand, as illustrated in FIG. 12, the surveying instrument 2 includes a synchronous measuring unit 32 in the arithmetic processing unit 18, and CAD design data 31 in the storage unit 17.

The present embodiment can be carried out in a case where the surveying instrument 2 includes a high-performance arithmetic processing unit 18 and a small-sized high-capacity storage unit 17, and the configuration of the management system 1 can be further simplified.

Third Embodiment

Figure 13:
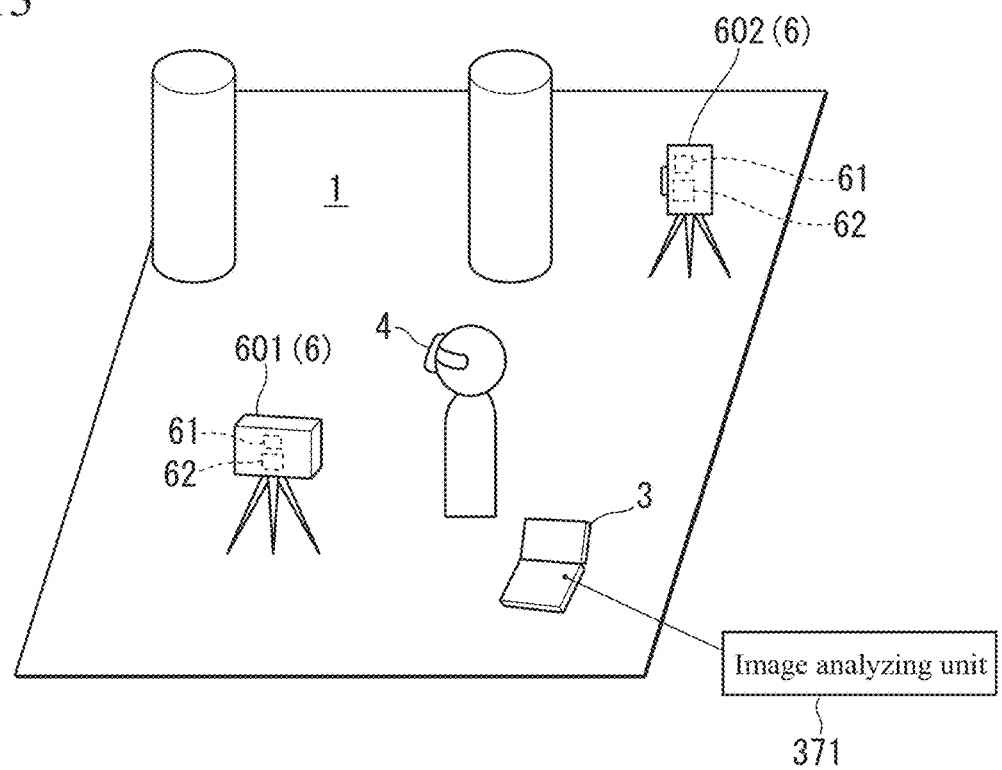
FIG. 13 is an external perspective view of a management system according to a third embodiment.

FIG. 13 is an external perspective view of a management system 1 according to a third embodiment, and illustrates an operation image at a construction site to be managed. The same components as those described in the first embodiment are provided with the same reference signs, and descriptions of these are omitted. The management system 1 according to the present embodiment includes a plurality of cameras 6, a processing PC 3, and an eyewear device 4. In the present embodiment, the cameras 6 are the "measuring device," and an image sensor 62 and an image analyzing unit 371 described later are the "coordinate measuring unit." The eyewear device 4 is the same as in the first embodiment.

At least two cameras 6 are provided and installed so that images of an actual construction product desired to be managed can be captured from two different points. One of the cameras 6 is installed at a known height so that the camera center faces the reference direction. The other camera 6 is installed at a point whose absolute coordinates are known at the same height so that a direction angle that the camera center faces is known from the reference direction.

Each camera 6 includes an image sensor 62 such as a CCD or a CMOS sensor. A captured image is subjected to signal processing in either a video format or a still image format. The image sensor 62 has an orthogonal coordinate system with an origin set at the camera center, and local coordinates of each pixel are identified. The camera 6 includes a communication unit 61, and connects to the Internet by using an Internet protocol (TCP/IP) and transmits and receives information to and from the processing PC 3.

The processing PC 3 further includes an image analyzing unit 371 configured by software in the arithmetic processing unit 30, and extracts common characteristic points in images of the actual construction product captured by the plurality of cameras 6, and acquires three-dimensional coordinates of the actual construction product by a photo survey. Then, the synchronous measuring unit 32 of the processing PC 3 sets local coordinates (X, Y) of the camera center of the camera 6 installed at the reference point to (x, y)=(0, 0), and converts a point obtained by subtracting the height of the camera from the local coordinate (Z) of the same camera center into (z)=(0), and after this, in relation to information from the cameras 6, manages relative positions and relative directions of the cameras 6 in the space with an origin set at the reference point.

A management flow in the present embodiment is described by reference to the management flow (FIG. 7) of the first embodiment. As an example, a description is given by using an example in which a first camera 601 and a second camera 602 are provided as the cameras 6.

Step S101 is the same as in the first embodiment. In the next Step S102, the administrator synchronizes the cameras 601 and 602. Specifically, the administrator installs the first camera 601 at the reference point, and installs the second camera 602 at another point whose absolute coordinates have been grasped.

Steps S103, S104, S105, and S106 are the same as in the first embodiment. In the next Step S107, the administrator captures images of a surrounding landscape including the target by using the cameras 601 and 602. The cameras 601 and 602 transmit captured images to the processing PC 3. The image analyzing unit 371 of the processing PC 3 acquires three-dimensional coordinates of the target and the surrounding of the target by a photo survey. In the next Step S108, by using the three-dimensional coordinates obtained in Step S107, the synchronous measuring unit 32 calculates difference information viewed from a point at the position in the direction of the eyewear device 4 as in the case of the first embodiment. Steps S109 and S110 are the same as in the first embodiment.

In the present embodiment, by photographically surveying a portion whose construction accuracy (deviation) is desired to be confirmed by the synchronized cameras 6, the same effect as in the first embodiment can be obtained.

Fourth Embodiment

A management system 1 according to a fourth embodiment is for further expanding the difference information in the first embodiment. In the first embodiment, construction accuracy of an actual construction product desired to be managed is acquired from information on a "point," however, in the fourth embodiment, construction accuracy of an actual construction product desired to be managed is confirmed from information on a "surface."

Figure 14:
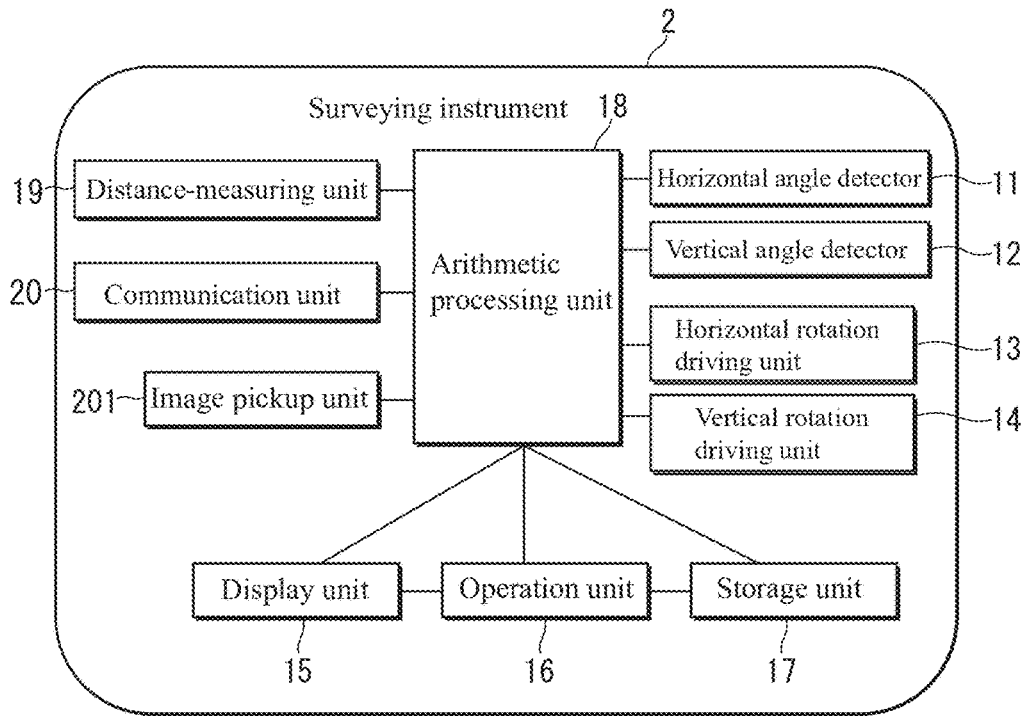
FIG. 14 is a configuration block diagram of a surveying instrument of a management system according to a fourth embodiment.
Figure 15:
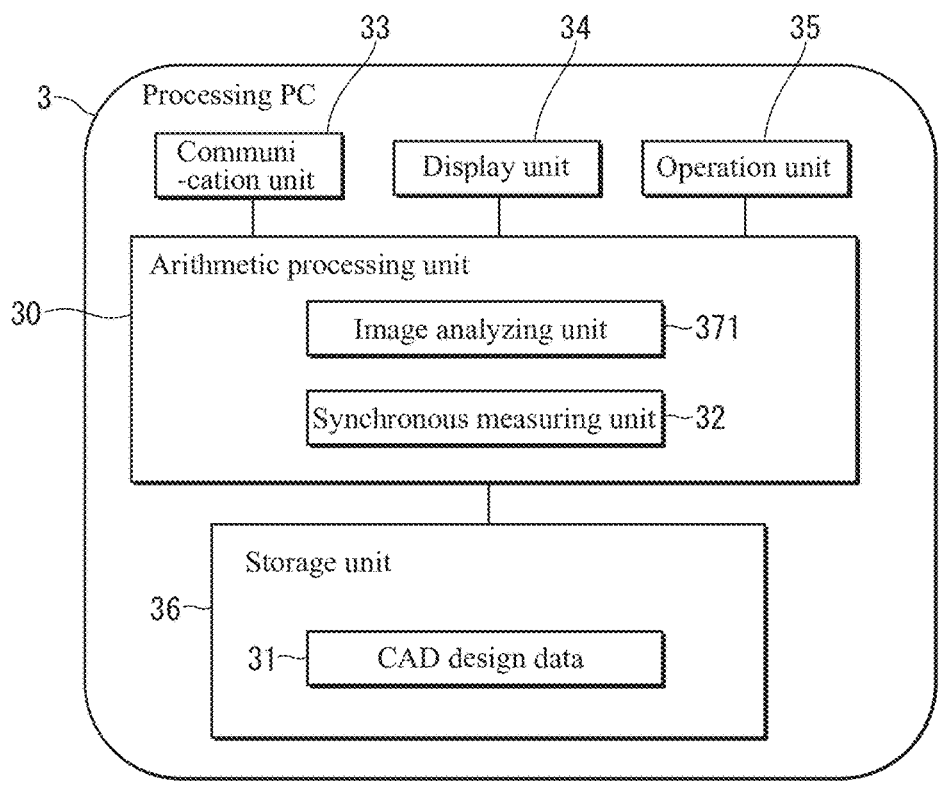
FIG. 15 is a configuration block diagram of a processing PC of the management system according to the same embodiment.

A management system 1 of the present embodiment includes, as in the first embodiment, a surveying instrument 2, a processing PC 3, and an eyewear device 4 (refer to FIG. 2). However, the surveying instrument 2 and the processing PC 3 include additional components. FIG. 14 is a configuration block diagram of the surveying instrument 2 of the management system 1 according to the fourth embodiment, and FIG. 15 is a configuration block diagram of the processing PC 3 of the management system 1 according to the fourth embodiment. The same components as those described in the first embodiment are provided with the same reference signs, and descriptions of these are omitted.

As illustrated in FIG. 14, the surveying instrument 2 further includes an image pickup unit 201. The image pickup unit 201 is, for example, a CCD or a CMOS sensor, and has an orthogonal coordinate system with an origin set at a camera center, and accordingly, local coordinates of the respective pixels are identified. The image pickup unit 201 is provided in the telescope 2c, and is configured to capture an image in the same direction as an output direction of distance-measuring light, and an optical axis of the distance-measuring light and the origin of the coordinate system match each other. The image pickup unit 201 is generally provided as an element as a tracking unit for automatically tracking a target in the surveying instrument 2.

As illustrated in FIG. 15, the processing PC 3 further includes an image analyzing unit 371. The image analyzing unit 371 performs pattern matching between an image captured by the image pickup unit 201 of the surveying instrument 2 and the CAD design data 31 (image recognition or fitting of dissimilarity to a near portion on CAD). When there is no great deviation between the actual construction product and the design data and the pattern matching in the image analyzing unit 371 has been successfully completed, based on the difference information of the coordinate point of the measured target, for each characteristic point (actual construction product) matched by the image analyzing unit 371, the synchronous measuring unit 32 calculates difference information (a difference in the horizontal direction and a difference in the vertical direction) from the CAD design data 31. Then, all calculated difference information is transmitted to the eyewear device 4.

Figure 16:
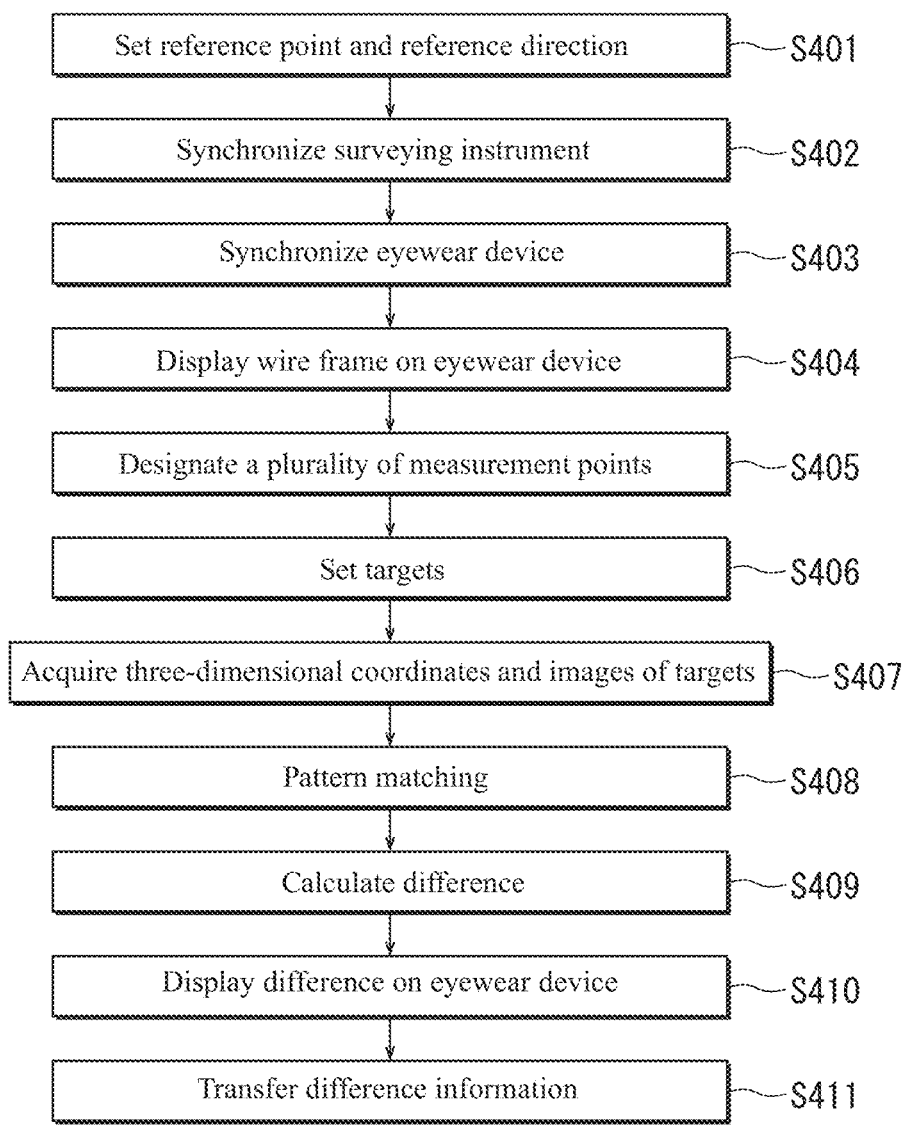
FIG. 16 is a management flowchart by the management system according to the same embodiment.
Figure 17:
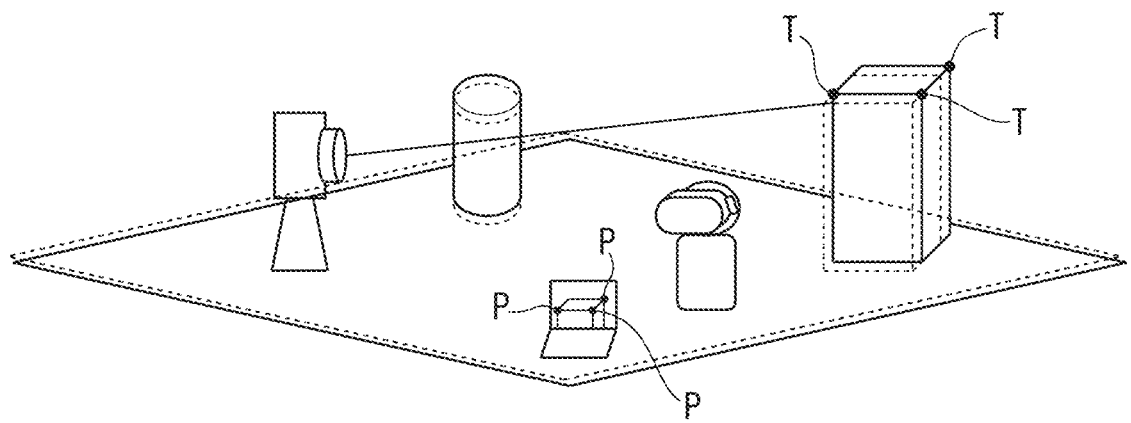
FIG. 17 is an operation imaginary view of the same management flow.
Figure 18:
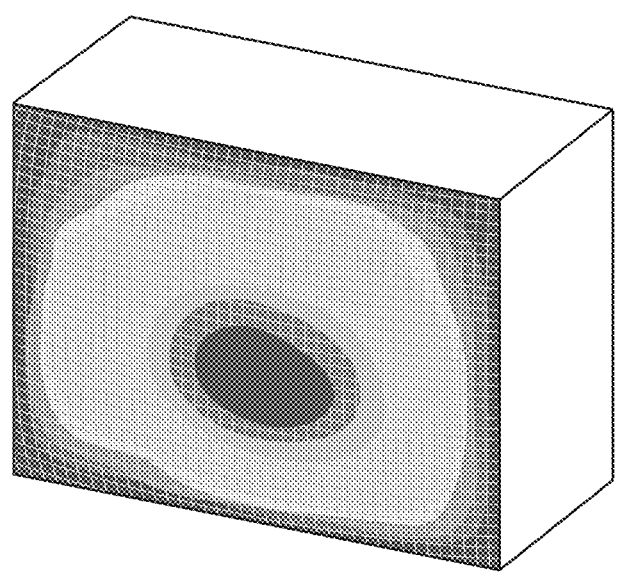
FIG. 18 is an imaginary view of an image to be obtained by the same management system.
Figure 19:
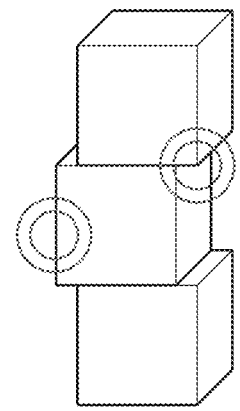
FIG. 19 is an imaginary view of an image to be obtained by the same management system.
Figure 20:
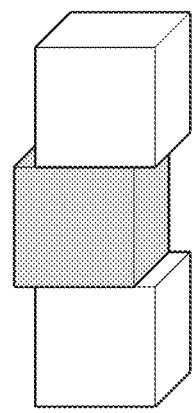
FIG. 20 is an imaginary view of an image to be obtained by the same management system.

FIG. 16 is a management flowchart by the management system 1 according to the fourth embodiment. FIG. 17 is an operation imaginary view of the same management flow, and FIGS. 18, 19, and 20 are imaginary views of images obtained by the same management system 1.

Steps S401 to S404 are the same as Steps S101 to S104 of the first embodiment. Next, in Step S405, the administrator designates a plurality of portions whose construction accuracies are desired to be confirmed as "measurement points" on the wire frame displayed on the processing PC 3 (for example, reference signs P in FIG. 17). Here, a main measurement point and several subsidiary measurement points are preferably designated.

Next, the process shifts to Step S406, and the administrator respectively sets targets (for example, reference signs T in FIG. 17) at (a plurality of) portions on the actual construction product corresponding to the (plurality of) measurement points designated on the CAD.

Next, the process shifts to Step S407, and the administrator or another operator measures distances and angles to the respective targets by using the surveying instrument 2. At the time of the distance measurement, the surveying instrument 2 additionally acquires images of surrounding landscapes including the targets by the image pickup unit 201. The surveying instrument 2 transmits three-dimensional coordinates of the respective targets and the images to the processing PC 3.

Next, the process shifts to Step S408, and the processing PC 3 acquires three-dimensional coordinates of the respective targets and at least one image. The image analyzing unit 371 performs pattern matching between the one image and the CAD design data 31. When the pattern matching is successfully completed, the process shifts to Step S409. When pattern matching is not successfully completed, pattern matching is applied to another image or the process returns to Step S407 and images are acquired again and subjected to pattern matching again.

When the process shifts to Step S409, the synchronous measuring unit 32 calculates difference information (a difference in the horizontal direction and a difference in the vertical direction) of each characteristic point (actual construction product) matched by the image analyzing unit 371 from the CAD design data 31. Then, the synchronous measuring unit 32 transmits all calculated difference information to the eyewear device 4.

Next, the process shifts to Step S410, and the eyewear device 4 displays the difference information that the eyewear device 4 received on the display 41. At this time, a plurality of difference information corresponding to the three-dimensional shape of the actual construction product has been acquired, so that the eyewear device 4 does not display the difference information as numerical values but converts the difference information into an image (surface image) from which the magnitude of the difference is visually understood and displays the image. FIGS. 18 to 20 illustrate display examples on the display 41 of the eyewear device 4 at the time of Step S410. FIG. 18 illustrates an example in which the shade of the color at a portion where the largest displacement has occurred turned darkest and the displacement amount is displayed in the form of a heat map. FIG. 19 illustrates an example in which a color shade marker is displayed at a portion (area) where a difference not less than a prescribed value has occurred. It is also possible to simultaneously display a plurality of areas, and it is also preferable that the shade of color differs according to the magnitude of the difference. FIG. 20 illustrates an example in which, when CAD is configured on the component-level basis in the CAD design data 31, an element with a large difference is displayed in a different shade of the color from that of other elements.

According to the present embodiment, by image recognition of a construction site by using the image pickup unit 201 of the surveying instrument 2 in the first embodiment, a portion whose construction accuracy is desired to be confirmed can be expanded from a "point" to a "surface." In addition, the administrator can visually recognize a deviation amount between an actual construction product and design data based on surface information only by wearing the eyewear device 4, so that the administrator easily notices, for example, a tilt of a member and an unexpected bulge on a portion of a member.

(Modification 1)

Figure 21:
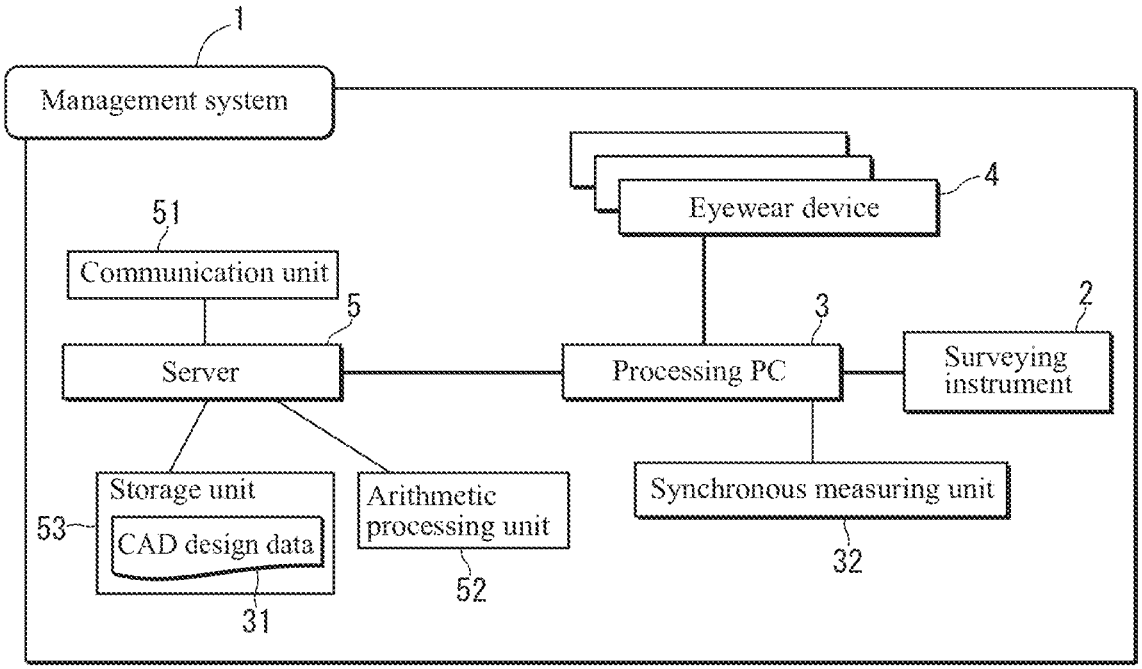
FIG. 21 is a configuration block diagram of Modification (1) of the management system of the first embodiment.

FIG. 21 is a configuration block diagram of a modification (hereinafter, referred to as Modification 1) of the management system 1 of the first embodiment. The management system 1 of Modification 1 includes a surveying instrument 2, a processing PC 3, an eyewear device 4, and a server 5. The server 5 includes at least a communication unit 51, an arithmetic processing unit 52, and a storage unit 53. In Modification 1, the CAD design data 31 is stored in the storage unit 53 of the server, and the synchronous measuring unit 32 is provided in the arithmetic processing unit 43 of the processing PC 3. The processing PC 3 acquires design data of a necessary portion from the server 5 via the communication unit 33 in Steps S104 and S108 in the management flow in the first embodiment. Accordingly, the burden on the storage unit 47 of the processing PC 3 can be reduced. It is also preferable to apply Modification 1 to the fourth embodiment.

(Modification 2)

Figure 22:
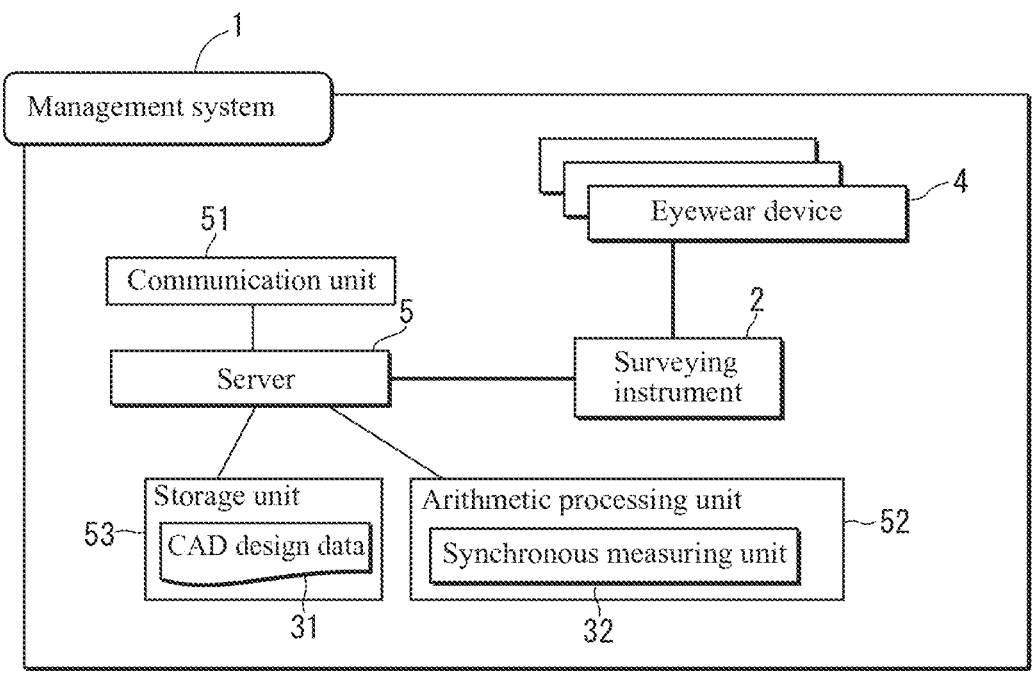
FIG. 22 is a configuration block diagram of Modification (2) of the management system of the second embodiment.

FIG. 22 is a configuration block diagram of a modification (hereinafter, referred to as Modification 2) of the management system 1 of the second embodiment. The management system 1 of Modification 2 includes a surveying instrument 2, an eyewear device 4, and a server 5. In Modification 2, the CAD design data 31 is stored in the storage unit 53 of the server, and the synchronous measuring unit 32 is provided in the arithmetic processing unit 52 of the server. Accordingly, the burden on the storage unit 17 of the surveying instrument 2 can be reduced, and synchronization processing in Steps S101 to S103 and arithmetic processing in Step S108 can be increased in speed.

(Modification 3)

Figure 23:
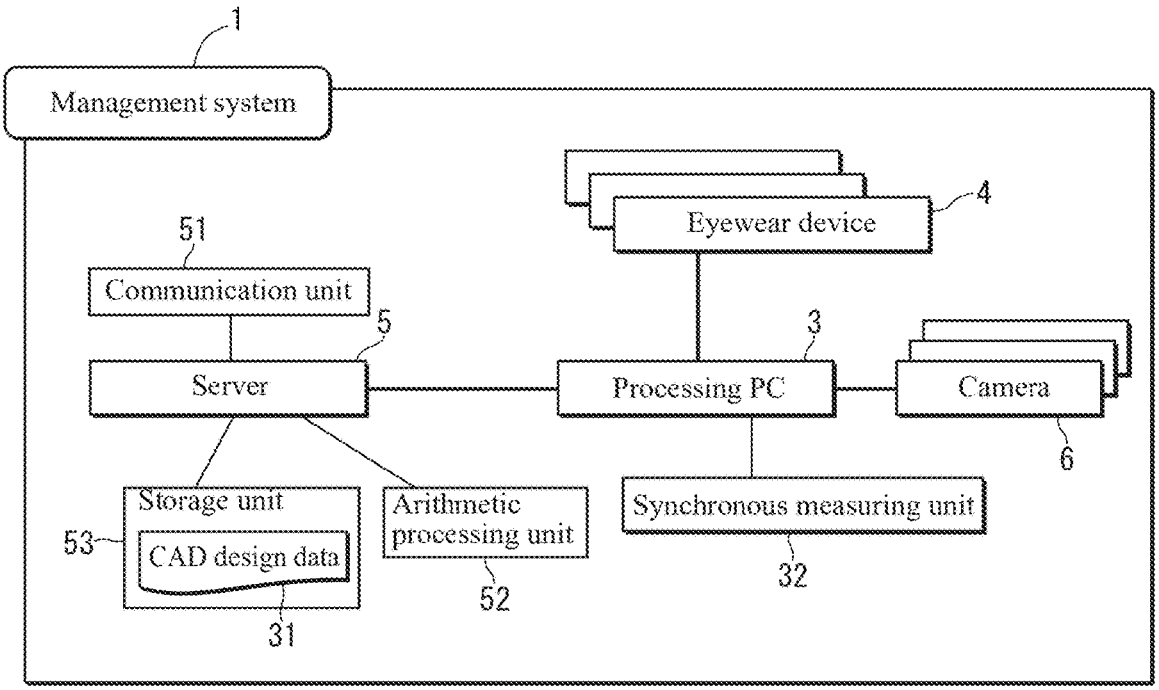
FIG. 23 is a configuration block diagram of Modification (3) of the management system of the third embodiment.

FIG. 23 is a configuration block diagram of a modification (hereinafter, referred to as Modification 3) of the management system 1 of the third embodiment. The management system 1 of Modification 3 includes a plurality of cameras 6, a processing PC 3, an eyewear device 4, and a server 5. In Modification 3, the CAD design data 31 is stored in the storage unit 53 of the server, and the synchronous measuring unit 32 is provided in the arithmetic processing unit 43 of the processing PC 3. The processing PC 3 acquires design data of a necessary portion from the server 5 via the communication unit 33 in Steps S104 and S108. Accordingly, the burden on the storage unit 47 of the processing PC 3 can be reduced.

(Modification 4)

Figure 24:
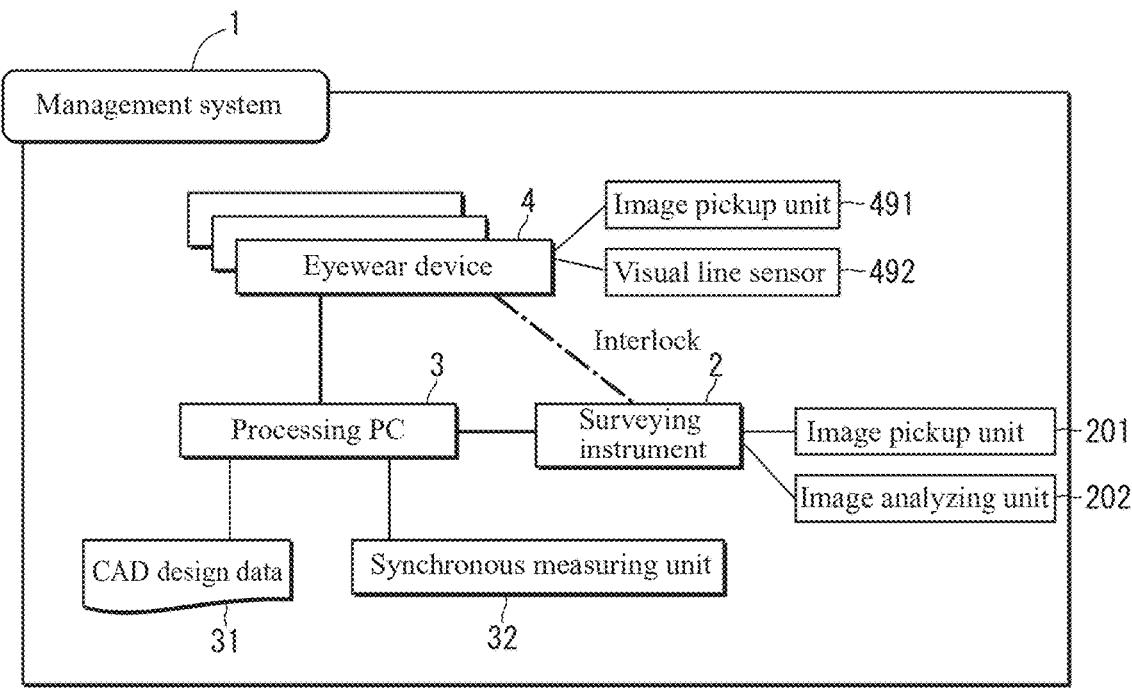
FIG. 24 is a configuration block diagram of Modification (4) of the management system of the first embodiment.

FIG. 24 is a configuration block diagram of a modification (hereinafter, referred to as Modification 4) of the management system 1 of the first embodiment. The management system 1 of Modification 4 includes a surveying instrument 2, a processing PC 3, and an eyewear device 4, and operations of the surveying instrument 2 and the eyewear device 4 are further interlocked with each other.

The eyewear device 4 further includes an image pickup unit 491 and a visual line sensor 492. The image pickup unit 491 is provided at the front side of the display 41 (a direction of the administrator's visual line), and the visual line sensor 492 is provided at the rear side of the display 31 (a direction toward the administrator's face). The image pickup unit 491 and the visual line sensor 492 are CCDs or CMOS sensors. The visual line sensor 492 detects the administrator's visual line based on a positional relationship between an eye inner corner position and an iris position, and calculates coordinates of a position of the administrator's visual line on the display 41. The communication unit 44 of the eyewear transmits and receives information to and from the communication unit 20 of the surveying instrument as well. In the case of the present modification, the display 41 may be configured as a video see-through display using the image pickup unit 491.

The surveying instrument 2 further includes an image pickup unit 201 and an image analyzing unit 202. The image pickup unit 201 is, for example, a CCD or a CMOS sensor. The image analyzing unit 202 performs pattern matching between an image captured by the image pickup unit 201 and an image captured by the image pickup unit 491 of the eyewear side, and identifies the image captured by the image pickup unit 491 of the eyewear side in the image captured by the image pickup unit 201 of the surveying instrument side.

In Modification 4, the eyewear device 4 transmits tilt data of the relative direction sensor 46 to the surveying instrument 2, and the surveying instrument 2 operates the horizontal rotation driving unit 13 and the vertical rotation driving unit 14 according to the tilt data that the surveying instrument 2 received, and moves a visual axis direction of the telescope 2c. In this way, operation of the eyewear device 4 and operation of the surveying instrument 2 can be interlocked with each other. Further, the surveying instrument 2 recognizes a position of the administrator's visual line as a target position, and automatically measures a distance and an angle to the target. These functions reduce the operational burden in Step S107, and also makes it possible to reduce the number of operators. It is also preferable to apply Modification 4 to the fourth embodiment.

Although embodiments and modifications of a preferred survey system and survey method according to the present invention have been described above, each embodiment and each modification can be combined based on the knowledge of a person skilled in the art, and such combined embodiments are also included in the scope of the present invention.

REFERENCE SIGNS LIST

1 Management system
2 Surveying instrument (measuring device)
11 Horizontal angle detector (coordinate measuring unit)
12 Vertical angle detector (coordinate measuring unit)
17 Storage unit
18 Arithmetic processing unit
19 Distance-measuring unit (coordinate measuring unit)
20 Communication unit
3 Processing PC
30 Arithmetic processing unit
31 CAD design data
32 Synchronous measuring unit
33 Communication unit
36 Storage unit
4 Eyewear device
41 Display
42 Control unit
43 Arithmetic processing unit
44 Communication unit
45 Relative position detection sensor
46 Relative direction detection sensor
47 Storage unit
5 Server
51 Communication unit
52 Arithmetic processing unit
53 Storage unit
6 Camera (measuring device)
61 Camera communication unit
62 Image sensor (coordinate measuring unit)

The invention claimed is:

1. A management system comprising:
a measuring device including a communication unit and a coordinate measuring unit for acquiring three-dimensional coordinates of a target;
an eyewear device including a communication unit, a display, a relative position detection sensor configured to detect a position of the eyewear device, and a relative direction detection sensor configured to detect a direction that the eyewear device faces;
a storage unit configured to store CAD design data of a management site; and
an arithmetic processing unit including at least a CPU, the CPU having a synchronous measuring unit configured to
receive information on a position and a direction of the measuring device and information on a position and a direction of the eyewear device, align a device-coordinate-origin and device-angle-reference-line of the measuring device and the eyewear device with a reference point and a reference direction set arbitrarily at the management site, manage each relative position and relative direction of the measuring device and the eyewear device in a space with the reference point as the origin, and synchronize a coordinate space of the measuring device, a coordinate space of the eyewear device, and a coordinate space of the CAD design data, wherein:

the synchronous measuring unit acquires information of a wire frame viewed from a point at the position in the direction of the eyewear device from the CAD design data, the eyewear device displays the information of the wire frame that the eyewear device received on the display by superimposing the information on an actual construction product, the synchronous measuring unit calculates, as difference information, a difference from a measurement point designated by an administrator on the CAD design data to a coordinate point of the target set corresponding to the measurement point by the administrator, and the eyewear device displays a numerical value of the difference information that the eyewear device received on the display.

2. The management system according to claim 1, wherein:
the measuring device further includes an image pickup unit configured to acquire local coordinates,
the arithmetic processing unit further includes an image analyzing unit configured to perform pattern matching between an image captured by the image pickup unit and the CAD design data,
the synchronous measuring unit calculates the difference information for a plurality of characteristic points matched by the image analyzing unit, and
the eyewear device converts the difference information that the eyewear device received into an image from which the magnitude of the difference is visually understood, and displays the image on the display.

3. The management system according to claim 1, wherein the measuring device is a surveying instrument including, as the coordinate measuring unit, a distance-measuring unit configured to measure a distance to the target by emitting distance-measuring light, and an angle-measuring unit configured to measure a rotation angle in the horizontal direction and a rotation angle in the vertical direction of the distance-measuring unit.

4. The management system according to claim 1, wherein the measuring device is a plurality of cameras each including, as the coordinate measuring unit, an image sensor and an image analyzing unit configured to capture an image of a surrounding landscape including the target and acquire local coordinates.

5. The management system according to claim 1, further comprising a plurality of eyewear devices, wherein the synchronous measuring unit is further configured to align a device-coordinate-origin and device-angle-reference-line of the measuring device and each of the plurality of eyewear devices with a reference point and a reference direction set arbitrarily at the management site, manage each relative position and relative direction of the measuring device and each eyewear device in a space with the reference point as the origin, and synchronize a coordinate space of the measuring device, a coordinate space of each of the eyewear devices, and a coordinate space of the CAD design data.

6. The management system according to claim 1, wherein the eyewear device displays a numerical value of the difference information that the eyewear device received on the display that is calculated exclusively on the basis of the spatial synchronization of the eyewear device and the measuring device without the need for the generation of a 3-D model of the target by the arithmetic processing unit.

7. A management method, using a measuring device including a communication unit and a coordinate measuring unit for acquiring three-dimensional coordinates of a target, and an eyewear device including a communication unit, a display, a relative position detection sensor configured to detect a position of the eyewear device in a management site, and a relative direction detection sensor configured to detect a direction that the eyewear device faces, a storage unit configured to store CAD design data of a management site; and an arithmetic processing unit including at least a CPU, the CPU includes a synchronous measuring unit configured to receive information on a position and a direction of the measuring device and information on a position and a direction of the eyewear device, and comprising:

a step of aligning a device-coordinate-origin and device-angle-reference-line of the measuring device and the eyewear device with a reference point and a reference direction set arbitrarily at the management site, managing each relative position and relative direction of the measuring device and the eyewear device in a space with the reference point as the origin, and synchronizing a coordinate space of the measuring device, a coordinate space of the eyewear device, and a coordinate space of CAD design data of the management site;

a step of transmitting information of a wire frame of the CAD design data viewed from a point indicated by the information to the eyewear device;

a step of displaying the received information of the wire frame on the display by superimposing the information on an actual construction product, a step of making an administrator designate a measurement point on the CAD design data;

a step of making the administrator set a target corresponding to the measurement point, and acquiring three-dimensional coordinates of the target;

a step of calculating, as difference information, a difference from the measurement point to a coordinate point of the target; and a step of displaying a numerical value of the difference information on the display.

8. The management method according to claim 7, wherein:
the measuring device further includes an image pickup unit configured to acquire local coordinates,
the CPU of the arithmetic processing unit further includes an image analyzing unit,
and the management method further comprises:
a step of making the administrator designate a plurality of measurement points on the CAD design data;
a step of making the administrator set a plurality of targets corresponding to the measurement points, and acquiring three-dimensional coordinates of the respective targets;
a step of capturing images of surrounding landscapes including the targets by the image pickup unit;
a step of performing pattern matching between the images captured by the image pickup unit and the CAD design data;
a step of calculating the difference information for a plurality of characteristic points matched by the pattern matching; and a step of converting the difference information into an image from which the magnitude of the difference is visually understood, and displaying the image on the display.

\* \* \* \* \*